United States Patent [19]

Holonyak, Jr. et al.

[11] Patent Number: 5,403,775
[45] Date of Patent: Apr. 4, 1995

[54] METHOD OF MAKING SEMICONDUCTOR DEVICES AND TECHNIQUES FOR CONTROLLED OPTICAL CONFINEMENT

[75] Inventors: Nick Holonyak, Jr.; Fred A. Kish, both of Urbana; Stephen J. Caracci, Champaign, all of Ill.

[73] Assignee: The Board of Trustees of the University of Illinois, Urbana, Ill.

[21] Appl. No.: 260,067

[22] Filed: Jun. 15, 1994

Related U.S. Application Data

[62] Division of Ser. No. 860,454, Mar. 30, 1992, Pat. No. 5,327,448.

[51] Int. Cl.$^6$ .............................. H01L 21/20
[52] U.S. Cl. .................... 437/129; 372/45; 372/46; 385/130; 385/131
[58] Field of Search ............ 437/129; 372/45, 46; 385/130, 131

[56] References Cited

U.S. PATENT DOCUMENTS

| | | | |
|---|---|---|---|
| 4,172,906 | 10/1979 | Pancholy | 437/237 |
| 4,176,206 | 11/1979 | Inoue | 427/82 |
| 4,291,327 | 9/1981 | Tsang | 357/52 |
| 4,378,255 | 3/1983 | Holonyak, Jr. et al. | 437/129 |
| 4,511,408 | 4/1985 | Holonyak, Jr. | 437/129 |
| 4,639,275 | 1/1987 | Holonyak, Jr. | 148/1.5 |
| 4,817,103 | 3/1989 | Holonyak, Jr. et al. | 372/45 |
| 5,018,811 | 5/1991 | Haavisto et al. | 350/96.12 |
| 5,055,422 | 10/1991 | Weisbuch et al. | 437/129 |

FOREIGN PATENT DOCUMENTS

642318 1/1989 Japan .

OTHER PUBLICATIONS

J. M. Dallesasse, N. Holonyak, Jr., A. R. Sugg, T. A. Richard, & N. El-Zein, "Hydrolization Oxidation of $Al_xGa_{1-x}As$–AlAs–GaAs Quantum Well Heterostructures and Superlattices", Appl. Phys. Lett. 57, 2844, Dec. 24, 1990.

J. M. Dallesasse & N. Holonyak, Jr., "Native–Oxide Stripe–Geometry $Al_xGa_{1-x}As$–GaAs Quantum Well Heterostrues Lasers", Appl. Phys. Lett. 58, 394, Jan. 28, 1991.

J. M. Dallesasse, N. Holonyak, Jr., D. C. Hall, N. El-Zein A. R. Sugg, S. C. Smith, & R. D. Burnham, "Native–Oxide–Defined Coupled–Stripe $Al_xGa_{1-x}As$–GaAs Quantum Well Heterostructure Lasers", Appl. Phys. Lett. 58, 834, Feb. 25, 1991.

A. R. Sugg, N. Holonyak, Jr., J. E. Baker, F. A. Kish, & J. M. Dallesasse, "Native Oxide Stabilization of AlAs–GaAs Heterostructures", Appl. Phys. Lett. 58, 1199, Mar. 18, 1991.

F. A. Kish, S. J. Caracci, N. Holonyak Jr., J. M. Dallesasse, A. R. Sugg, R. M. Fletcher, C. P. Kuo, T. D. Osentowski, & M. G. Craford, "Native–Oxide Stripe–Geometry $In_{0.5}(Al_xGa_{1-x})P$–$In_{0.5}Ga_{0.5}P$ Heterostructure Laser Diodes", Appl. Phys. Lett. 59, 354, Jul. 15, 1991.

N. El-Zein, N. Holonyak, Jr., F. A. Kish, A. R. Sugg, T. A. Richard, J. M. Dallesasse, S. C. Smith, & R. D. Burnham, "Native–Oxide–Masked Si Impurity–Induced Layer Disordering Of $Al_xGa_{1-x}As$–$Al_yAs$–$Al_zGa_{1-z}As$ Quantum–Well Heterostructures", J. Appl. Phys. 70, 2031, Aug. 15, 1991.

F. A. Kish, S. J. Caracci, N. Holonyak, Jr., J. M. Dallesasse, K. C. Hsieh, M. J. Ries, S. C. Smith, & R. D. Burnham, "Planar Native–Oxide Index–Guided $Al_x$-

(List continued on next page.)

*Primary Examiner*—R. Bruce Breneman
*Assistant Examiner*—Ramamohan R. Paladugu
*Attorney, Agent, or Firm*—Martin Novack

[57] ABSTRACT

The disclosure is directed to improved techniques and devices employing an aluminum-bearing III–V semiconductor material and a native oxide of aluminum that is formed in the semiconductor material. Effective optical confinement, tailored to obtain desired operating conditions, can be achieved with a thick native oxide of aluminum that extends through at least one-third of the thickness of the aluminum-bearing layer in which the native oxide is formed. The resultant lateral index step can be made quite large and employed for devices such as ring lasers.

19 Claims, 13 Drawing Sheets

OTHER PUBLICATIONS $Ga_{1-x}As$-GaAs Quantum Well Heterostructure Lasers", Appl. Phys. Lett. 59, 1755, Sep. 30, 1991.

N. El-Zein, F. A. Kish, N. Holonyak, Jr., A. R. Sugg, M. J. Ries, S. C. Smith, J. M. Dallesasse, and R. D. Burnham, "Native-Oxide Coupled-Cavity $Al_xGa_{1-x}As$-GaAs Quantum Well Heterostructure Laser Diodes", Appl. Phys. Lett. 59, 2838, Nov. 25, 1991.

F. A. Kish, S. J. Caracci, N. Holonyak, Jr., and S. A. Maranowski, J. M. Dallesasse, R. D. Burnham, and S. C. Smith, "Visible Spectrum Native-Oxide Coupled-Stripe $In_{0.5}(Al_xGa_{1-x})_{0.5}P$-$In_{0.5}Ga_{0.5}P$ Quantum Well Heterostructure Laser Arrays", Appl. Phys. Lett. 59 2883, Nov. 25, 1991.

F. A. Kish, S. J. Caracci, N. Holonyak, Jr., P. Gavrilovic, K. Meehan, & J. E. Williams, "Coupled-Stripe In-Phase Operation of Planar Native-Oxide Index-Guided $Al_yGa_{1-y}As$-GaAs-$In_xGa_{1-x}As$ Quantum-Well Heterostructure Laser Arrays", Appl. Phys. Lett. 60, 71, Jan. 6, 1992.

F. A. Kish, S. J. Caracci, S. A. Maranowski, N. Holonyak, Jr., K. C. Hsieh, C. P. Kuo, R. M. fletcher, T. D. Osentowski, & M. G. Craford, "Planar Native-Oxide Buried-Mesa $Al_xGa_{1-x}As$-$In_{0.5}(Al_yGa_{1-y})_{0.5}P$-$In_{0.5}(Al_zGa_{1-z})_{0.5}P$ Visible-Spectrum Laser Diodes", J. Appl. Phys. 71, 2521, Mar. 15, 1992.

M. J. Ludowise, "Metalorganic Chemical Vapor Deposition Of III-V Semiconductors", J. Appl. Phys., 58, R31 1985.

G. E. Smith, "Phase Matching In Four-Layer Optical Waveguides", IEEE J. Quantum Electron, QE-4, 288 (1968).

E. Marcatelli, "Bends In Optical Dielectric Guides", Bell Syst. Tech. J. 48, 2103, 1969.

P. Sansonetti et al., "Low-Threshold GaAs/GaAlAs Buried Heterostructure Laser With An Ion-Beam Etched Laser With An Ion-Beam-Etched Quarter Ring Cavity", Electron Lett. 23, 485 (1987).

J. Butler et al., "Coupled-Mode Analysis Of Phase-Locked Injection Laser Arrays", Appl. Phys. Lett., 44, 293, 1984.

L. J. Guido, W. E. Plano, G. S. Jackson, N. Holonyak, Jr., R. D. Burnham, & J. E. Epler, "Coupled-Stripe $Al_xGa_{1-x}As$-GaAs Quantum Well Lasers Defined By Vacancy-Enhanced Impurity-Induced Layer Disordering From $(Si_2)_y$ $(GaAs)_{1-y}$ Barriers", Appl. Phys. Lett. 50, 757 (1987).

J. S. Major, Jr., D. C. Hall, L. J. Guido, N. Holnyak Jr., P Gavrilovic, K. Meehan, J. E. Williams, & W. Stutius, "High-Power Disorder-Defined Coupled Stripe $Al_yGa_{1-y}As$-GaAs-$In_xGa_{1-x}As$ Quantum Well Heterostructure Lasers", Appl. Phys. Lett. 55, 271 (1989).

J. Carran et al., "GaAs Lasers Utilizing Light Propagation Along Curved Junctions", IEEE J. Quantum Electron. QE-6 367 (1970).

A. S. H. Liao et al., "Semiconductor Injection Lasers With a Circular Resonator", Appl. Phys. Lett. 36, 801 (1980).

D. G. Deppe, G. S. Jackson, N. Holonyak, Jr., R. D. Burnham, & R. L. Thornton, "Coupled Stripe $Al_xGa_{1-x}As$-GaAs Quantum Well Lasers Defined By Impurity-Induced (Si) Layer Disordering", Appl. Phys. Lett. 50, 632 (1987).

R. D. Dupuis et al., Proceedings of the International Symposium on GaAs and Related Compounds, "Preparation And Properties Of $Ga_{1-x}Al_xAs$-GaAs Heterojunctions Grown By Metallorganic Chemical Vapour Deposition", pp. 1–9, Inst. of Physics, Londong, 1979.

Dallesasse et al. in Appl. Phys. Lett., 57, Dec. 1990, "Hydrolyzation oxihation of AlGaAs-AlAs-GaAs quantum well".

Kish et al. in Appl. Phys. Lett. 59, Jul. 1991, "Native-oxide stripe-geometry InAlGaP-InGaP heterostructure laser diodes".

ℏω

ℏω

METHOD OF MAKING SEMICONDUCTOR DEVICES AND TECHNIQUES FOR CONTROLLED OPTICAL CONFINEMENT

This is a divisional of U.S. application Ser. No. 07/860,454, filed Mar. 30, 1992, now U.S. Pat. No. 5,327,448.

FIELD OF THE INVENTION

This invention relates to semiconductor devices and, more particularly, to techniques which employ a grown native oxide of aluminum to obtain improvements in III-V semiconductor devices that employ step(s) and/or grading of index of refraction for optical confinement. The techniques and devices hereof are applicable to semiconductor lasers including ring lasers, and to active or passive optical waveguiding in opto-electronic circuits.

The present invention was made, in part, with Government support under Army Research Office Contract No. DAAL 03-89-K-008, and National Science Foundation Grant No.s ECD 89-43106 and DMR 89-20538. The Government has certain rights in this invention.

BACKGROUND OF THE INVENTION

Semiconductor lasers in the shape of a ring, or a partial ring, have been known in the art for a number of years. Reference can be made, for example, to J. Carran et al., IEEE J. Quantum Electron. QE-6 367 (1970); A. S. H. Liao et al., Appl. Phys. Lett. 36, 801 (1980); and P. Sansonetti et al., Electron Lett. 23, 485 (1988). These types of devices have various applications and proposed applications. For example, it has been proposed that a semiconductor ring laser, in which light circulates in both clockwise and counter-clockwise directions, could be used as a very small and inexpensive gyroscope. Briefly, certain motion of the gyroscope would have a different effect on the clockwise and counter-clockwise light components, and the effect can be measured to determine the motion or orientation of the device. Ring lasers, or "circular resonators" have also been proposed for applications such as filtering and multiplexing in so-called opto-electronic or integrated optical circuits. Fractions of a ring, such as a half-ring or a quarter-ring, with cleaved facets, have been used for various applications in optical communications.

In a ring laser the curved light path makes optical confinement more difficult. Because of the greater incident angles the light subtends with respect to the confining walls (particularly for a small radius of curvature), the difference in indices of refraction must be relatively large to ensure internal reflection of sufficient light in the ring laser "waveguide". It is among the objects of the present invention to overcome difficulties in the prior art of producing a laser in the shape of a ring or having a curved light path, for example part of a ring or a non-circular arc.

Another application where control of index of refraction is important is in coupled-stripe laser diode arrays. These arrays offer the possibility of obtaining high output powers with decreased beam divergence and single-longitudinal mode operation. Index-guided arrays, compared to their gain-guided counterparts, have advantages of increased mode stability and coherence, and decreased beam astigmatism. Several methods have been employed to fabricate index-guided arrays, including: channel etching, epitaxial regrowth or overgrowth, and impurity induced layer disordering ("IILD") [see, for example, D. G. Deppe et al., Appl. Phys. Lett. 50, 632 (1987); L. J. Guido, Appl. Phys. Lett. 50, 757 (1987); and J. S. Major, Jr. et al., Appl. Phys. Lett. 55, 271 (1989)]. Many of these techniques require relatively sophisticated processing and/or provide limited control of the index-step between emitters. More precise adjustment of the index-step would permit control of the optical field between emitters and, thus, control of the coupling between stripes. This coupling dramatically affects the far-field radiation patterns, determining the supermode(s) in which the array will oscillate. It is among the further objects of the invention to provide selectable index-guided lateral confinement in laser diodes and other semiconductor optical devices.

Opto-electronic circuits (in which devices in a semiconductor chip have interacting optical and electronic elements) are utilized in conjunction with fiber optics communications systems and are expected to ultimately have widespread application for other systems. In such circuits, circular or other curved optical signal paths are needed, particularly for the design and fabrication of relatively complex circuits.

It is also among the objects of the present invention to provide an efficient semiconductor optical waveguide for use in opto-electronic semiconductor circuits.

SUMMARY OF THE INVENTION

The present invention is directed to improved techniques and devices employing, inter alia, an aluminum-bearing III-V semiconductor material and a native oxide of aluminum that is formed in the semiconductor material.

In the copending U.S. patent application Ser. No. 721,843 of N. Holonyak, Jr. and J. Dallesasse, filed Jun. 24, 1991, which is a continuation-in-part of U.S. patent application Ser. No. 636,313, filed Dec. 31, 1990, both assigned to the same assignee as the assignee of the present application, there is disclosed a technique of forming a high quality, stable, and compact native oxide layer from an aluminum-bearing Group III-V semiconductor material. [Reference can also be made to Dallesasse et al., Appl. Phys. Lett. 57 (26), 2844–6, 24 Dec. 1990; Dallesasse et al., Appl. Phys. Lett. 58 (4), 394–396, 28 Jan. 1991; Dallesasse et al., Appl. Phys. Lett 58 (8), 834–836, 25 Feb. 1991; and Sugg et al., Appl. Phys. Lett 58 (11), 1199–1201, 18 Mar. 1991.] The technique comprises exposing an aluminum-bearing Group III-V semiconductor material to a water-containing environment and a temperature of at least about 375° C. to convert at least a portion of the aluminum-bearing Group III-V semiconductor material to a native oxide. The thickness of said native oxide formed thereby is substantially the same as or less than the thickness of that portion of said aluminum-bearing III-V semiconductor material converted into the native oxide. The native oxide layer thus grown is denser and more stable than oxide layers formed from previous methods, meaning, for example, that they do not degrade under conditions of normal use and atmospheric exposure. Further, the native oxide was demonstrated to exhibit improved operating and performance characteristics, for example with regard to metallization adherence and dielectric properties. The native oxides were described as being useful in lasers, transistors, capacitors, waveguides and in other electrical and opto-electrical devices. Anhydrous oxides of aluminum were noted to exhibit a relatively low index of refraction (less than about 2.0) and index of refraction can be used to distinguish the anhydrous oxide forms from the higher index hydrated oxide forms that are generally unsuitable for semiconductor applications due to properties such as expansion and instability.

A feature of the present invention involves the discovery that, in laser diodes and other semiconductor optical devices including passive waveguides, effective optical confinement, tailored to obtain desired operating conditions, can be achieved with a thick (generally, at least 3000 Å) native oxide of aluminum that extends through at least one-third of the thickness of the aluminum-bearing layer in which the native oxide is formed. The resultant lateral index step can be made quite large and employed for devices such as ring lasers.

A form of the invention is directed to a method of making a semiconductor laser having a light path that is at least partially curved, and comprises the following steps: forming a layered semiconductor structure comprising an active region between first and second semiconductor confining layers, the first and second semiconductor confining layers being of opposite conductivity types, and said first semiconductor confining layer being an aluminum-bearing III–V semiconductor material; applying a mask pattern over said first semiconductor confining layer, the pattern including a stripe that is at least partially curved; exposing unmasked portions of the first semiconductor confining layer to a water-containing environment and a temperature of at least 375 degrees C. for a time sufficient to form a thick native oxide of aluminum in said first semiconductor confining layer; and coupling respective electrodes with said first and second semiconductor confining layers. Generally, the active region includes at least a waveguide layer and a quantum well layer, and the respective electrodes are coupled to the semiconductor confining layers through further respective semiconductor layers. The aluminum-bearing material may comprise, for example, $Al_xGa_{1-x}As$, where x is at least 0.3. Generally, a higher aluminum fraction, for example $x=0.7$ or greater will be used to facilitate the thick oxide growth rate, which also depends on temperature. A temperature of at least about 450 degrees C. is generally preferred. For a ring laser, the time of exposure may be selected to have said native oxide extend through at least most of the thickness of said first confining layer, and possibly through the entire thickness of said first confining layer.

A further form of the invention is directed to a semiconductor laser device comprising: a semiconductor active region disposed between first and second semiconductor confining layers, the first and second semiconductor confining layers being of opposite conductivity type, and said first semiconductor confining layer being an aluminum-bearing III–V semiconductor material; first and second electrode means respectively coupled with the first and second confining layers, said first electrode means including a conductive stripe; and lateral confining regions of a native oxide of aluminum formed in the confining layer adjacent the elongated edges of said stripe, said native oxide of aluminum having a thickness of at least 3000 Angstroms and extending through at least one-third of the thickness of said first confining layer.

In another form of the invention, a method is set forth for producing a lateral index of refraction step of predetermined effective size which comprises the following steps: forming a layered semiconductor structure that includes a second semiconductor layer, a waveguide layer disposed on the second semiconductor layer, and a first semiconductor layer disposed on the waveguide layer, said first semiconductor layer being an aluminum-bearing III–V semiconductor material; applying a masking pattern over at least part of the first semiconductor layer; initiating treatment of the unmasked surface of the first semiconductor layer with a water-containing environment and a temperature of at least 375 degrees C. to initiate formation of a native oxide of aluminum in said first semiconductor layer; and continuing said treatment for a selected period of time that determines the size of the effective lateral index of refraction step in the lateral direction of said waveguide layer and said first semiconductor layer.

Still another form of the invention is a semiconductor passive optical waveguide that employs a thick native oxide of aluminum.

Further features and advantages of the invention will become more readily apparent from the following detailed description when taken in conjunction with the accompanying drawings.

DETAILED DESCRIPTION

Figure 1:
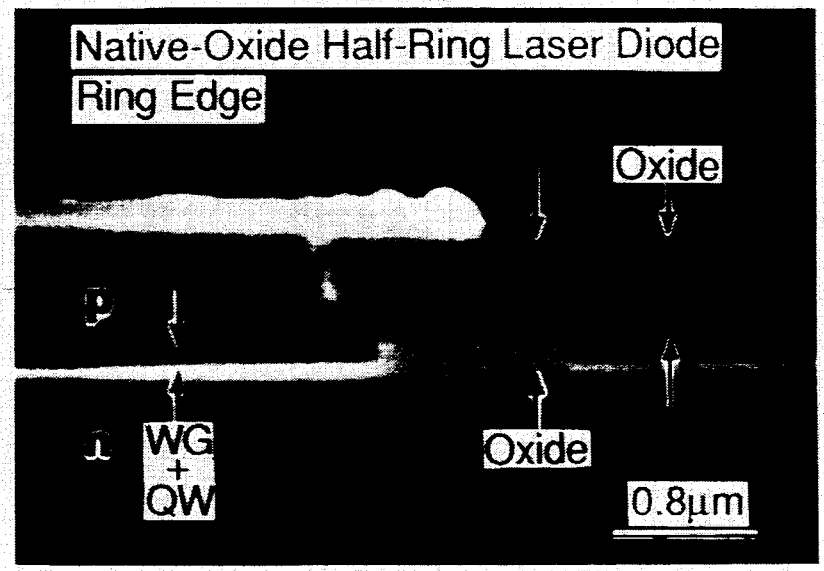
FIG. 1 is a scanning electron microscope image of a stained cross-section of a device in accordance with an embodiment of the invention.

In an example hereof, a quantum well heterostructure is grown by metal-organic chemical vapor deposition ["MOCVD"—see for example, R. D. Dupuis et al., Proceedings of The International Symposium on GaAs and Related Compounds, pp. 1–9, Institute of Physics, London, 1979, and M. J. Ludowise, J. Appl. Phys., 58, R31, 1985] on an n-type GaAs substrate. After a GaAs buffer layer, an $Al_{0.8}Ga_{0.2}As$ lower confining layer is grown to a thickness of about 1 $\mu m$. [The confining layers are also sometimes called cladding layers.] The active region of the quantum well heterostructure is then grown, and includes symmetrical $Al_{0.25}Ga_{0.75}As$ waveguide layers, undoped and of thickness about 750 Å each, on either side of a GaAs quantum well of thickness about 100 Å. An upper confining (or cladding) layer of p-type $Al_{0.8}Ga_{0.2}As$ is grown to a thickness of about 0.6 $\mu m$, and a heavily doped p-type GaAs contact layer is grown thereon, the contact layer having a thickness of about 800 Å. In this example, fabrication of a laser begins with the patterning of about 1000 Å of $Si_3N_4$ into rings [25-$\mu m$ wide annulus, 250 $\mu m$ inside diameter (ID), 300 $\mu m$ outside diameter (OD)]. The $Si_3N_4$ rings serve as a mask for the chemical etching ($H_2SO_4:H_2O_2:H_2O$, 1:8:80) of the contact layer, thus leaving the $Al_xGa_{1-x}As$ upper confining layer exposed inside and outside of the masked rings. The sample is then placed in an open tube furnace, supplied with $H_2O$ vapor and $N_2$, at 450° C. for 35 minutes. This process results in the conversion of the upper confining layer (where exposed) to a native oxide having an index of refraction of about 1.6. In this case, at the ring edges the oxide extends downward through the entire upper confining layer as shown in FIG. 1 by the scanning electron microscope (SEM) image of a stained cross section. The oxide is deeper at the ring edge than beyond (to the right in FIG. 1). This effect may be a result of changes in $H_2O$ adsorption, O/H diffusion, or stress induced by the presence of the masking stripe. The oxide profile is fairly isotropic, however, extending laterally essentially to the same extent as it does in depth. Transmission electron microscope (TEM) images of similarly oxidized crystals indicate that some oxidation (about 200 Å) of the underlying $Al_{0.23}Ga_{0.77}As$ waveguide region occurs. Thus, the low-index native oxide extends into the waveguide, layer, creating large lateral index steps for sidewise optical confinement and waveguiding. Calculations based on propagation in a 4-layer slab waveguide [see G. E. Smith, IEEE J. Quantum Electron., QE-4, 288 (1968)] for this deep oxide edge indicate an effective lateral index step greater than 0.05. For this example, structures with the native oxide located about 1000 Å vertically away from the waveguide result in an insufficient index step for ring oscillation. However, as discussed further below, effective lasers can be made with lateral native oxide that extends only partially through the confining layer.

After the indicated oxidation, the $Si_3N_4$ masking rings are selectively removed in a $CF_4$ plasma, resulting in a self-aligned geometry. The sample is then Zn-diffused (540° C., 20 min) to improve the contacts and metallized with Ti-Au for the p-type contact and Ge-Ni-Au for the n-type contact. In an example hereof the rings are then cleaved in half (or on a chord through the annulus) and the remaining three sides of the crystal are saw cut (SC) to prevent resonance across the edges. The surface of a typical half-ring laser diode hereof after metallization, cleaving, and sawing is shown in the inset of FIG. 2.

Figure 2:
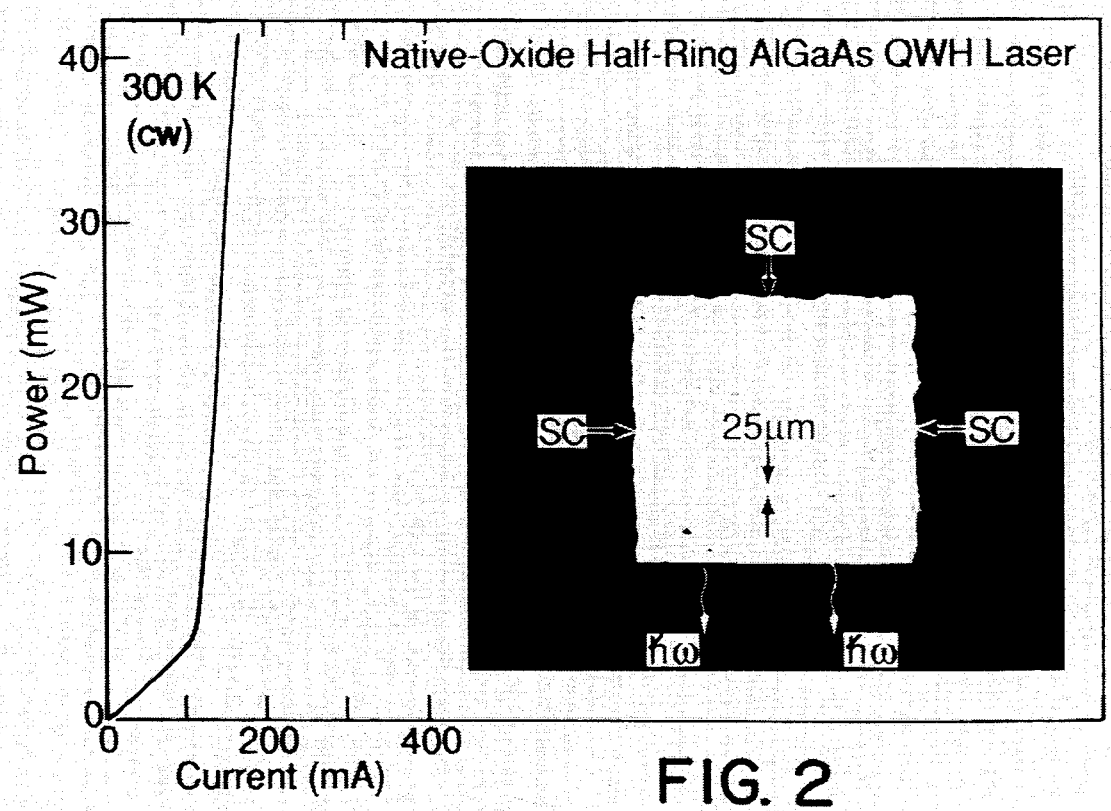
FIG. 2 is a graph of cw light output (both ring ends) versus current for a device in accordance with an embodiment of the invention, and shows, in an inset, a surface photograph of the device.

The 300K cw light versus current (L–I) curve of a typical half-ring laser diode hereof is shown in FIG. 2. The threshold current is $\sim 105$ mA ($\sim 890$ A/cm$^2$). The curve is linear above threshold with a total external differential quantum efficiency ($\eta$ of $\sim 49\%$) and a total output power (both ends of the half ring) exceeding 40 mW. The pulsed threshold (2 $\mu s$ pulse width, 0.5% duty cycle) of this diode is 78 mA.

Figure 3:
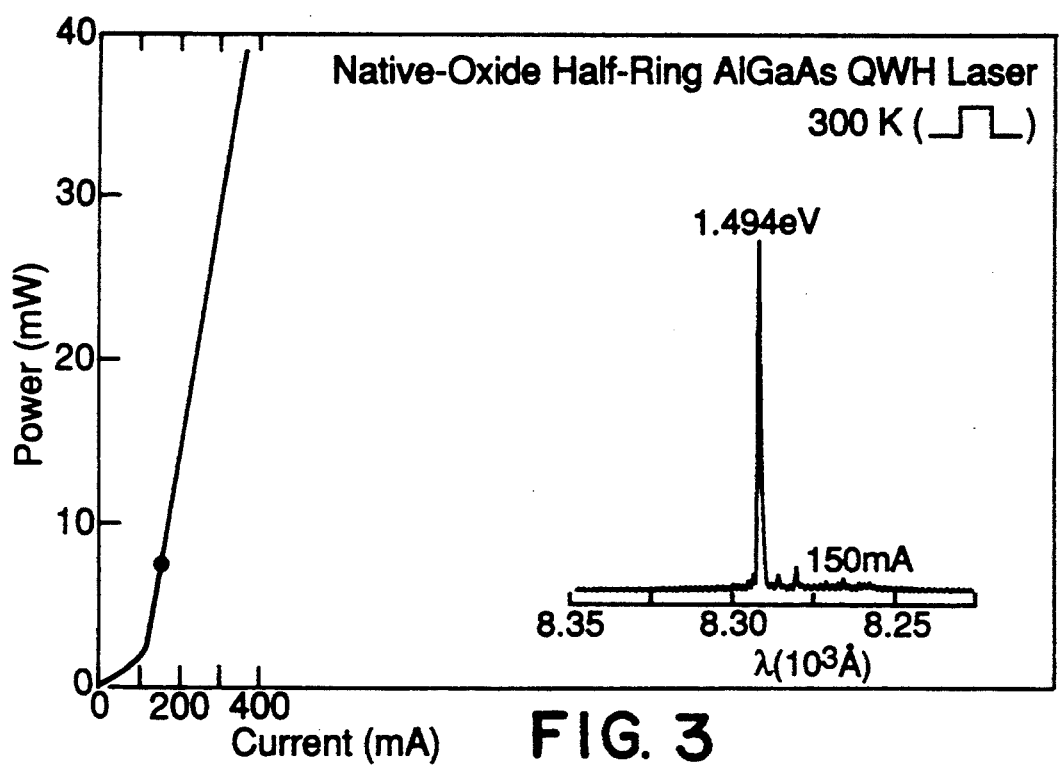
FIG. 3 is a graph of pulsed light output (both ring ends) versus current for a device in accordance with an embodiment of the invention and shows, in the inset, single mode operation.

The pulsed (2 $\mu s$, 0.5% duty cycle) L–I characteristic of a moderate quality half-ring laser diode, fabricated as above, is shown in FIG. 3. The diode threshold current is $\sim 103$ mA. Longitudinal mode spectra show well defined modes, with single-mode operation occurring at 150 mA (FIG. 3, inset). The mode spacing ($\Delta \lambda$) is $\sim 1.7$ Å, corresponding to a cavity length of $\sim 560$ $\mu m$. This is longer than the half-circumference ($\sim 470$ $\mu m$) and may be due to some misalignment of the cleave (creating a longer cavity) or a longer effective path length caused by the curved resonator.

Operation around the curved resonator is confirmed by imaging the output of each end of the half-ring laser separately into a monochromator. The longitudinal mode spectrum is confirmed to be identical from each end, indicating that laser emission indeed occurs from the circular cavity (data not shown). Further evidence of oscillation around the circular cavity was provided by sawing a half-ring device, which is originally observed to lase, in two along the vertical arrows "SC" and "25 $\mu m$" in the inset of FIG. 2. This was found to destroy the resonator and the laser operation. If the device were originally lasing linearly from the front cleave to the opposite saw cut (SC), the device should continue to exhibit laser operation, which is not the case. Thus, there is strong confirmation that laser operation occurs around the ring. However, half-ring laser diodes that were cleaved in two (not saw cut) to form quarter-ring diodes continue to lase, with stimulated emission being observed from both perpendicular cleaved facets.

Figure 4:
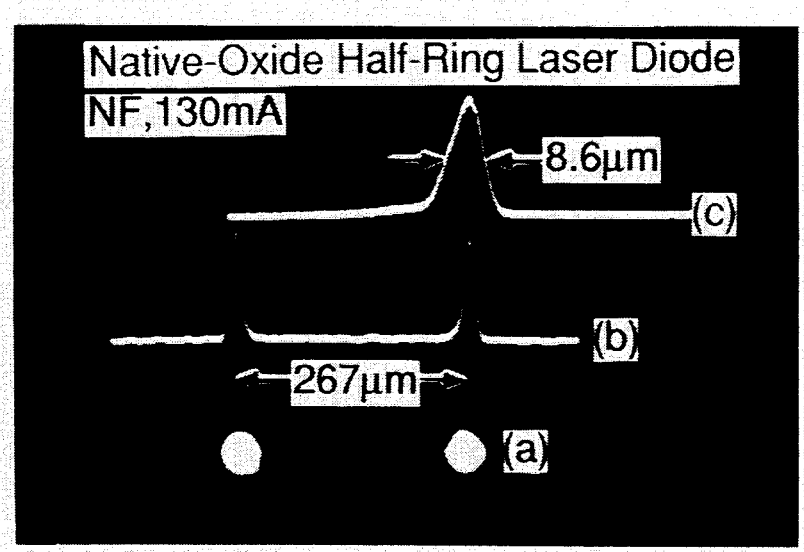
FIG. 4 shows near field image plots for the FIG. 3 device.

The near field (NF) intensity profiles of the laser diode of this example are collected with a f/0.95 25 mm focal length lens. A low magnification view (Si MOS camera) with the diode operating at 130 mA (pulsed) shows distinct emission from the two ends of the half-ring laser (FIG. 4(a)). The 267 $\mu m$ center-to-center separation agrees well with the device geometry. The corresponding intensity profiles (CCD array image) are shown in FIG. 4(b). Both peaks exhibit asymmetry, with the intensity dropping off faster towards the outside diameter (OD) of the annulus. This asymmetry is more evident in the higher magnification view of the right-hand end (FIG. 4(c)). Such asymmetric intensity profiles agree well with those calculated for a circular waveguide (see E. Marcatilli, Bell Syst. Tech. J. 48, 2103, 1969).

Polarization-resolved L-I characteristics indicate that the half-ring diodes lase in the TM mode. This behavior is opposite to that observed in conventional GaAs QWH laser diodes and in native-oxide defined linear resonator QWH laser diodes, which lase in the TE mode. The radiation losses in the native-oxide circular resonator for the TE modes are greater than for the TM modes, indicating application for mode filtering.

Figure 5:
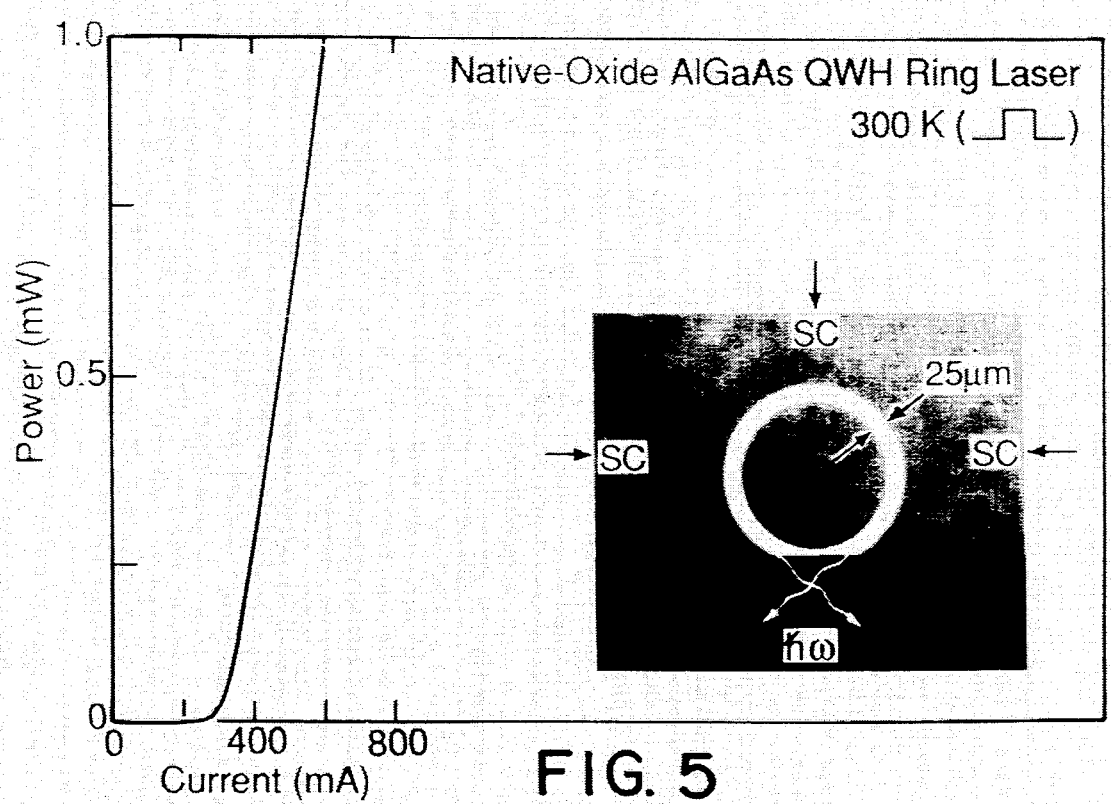
FIG. 5 is a graph of pulsed light output versus current for another device in accordance with the invention, the inset showing the device geometry.

FIG. 5 shows the L-I characteristic of a native oxide ring laser diode fabricated in similar manner but on a lower (vertical) confinement $Al_xGa_{1-x}As$-GaAs QWH laser crystal ($x \sim 0.6$ confining layers). A cleave through the ring annulus permits laser light to leak out (inset of FIG. 5), with oscillation still maintained around the ring.

Figure 6:
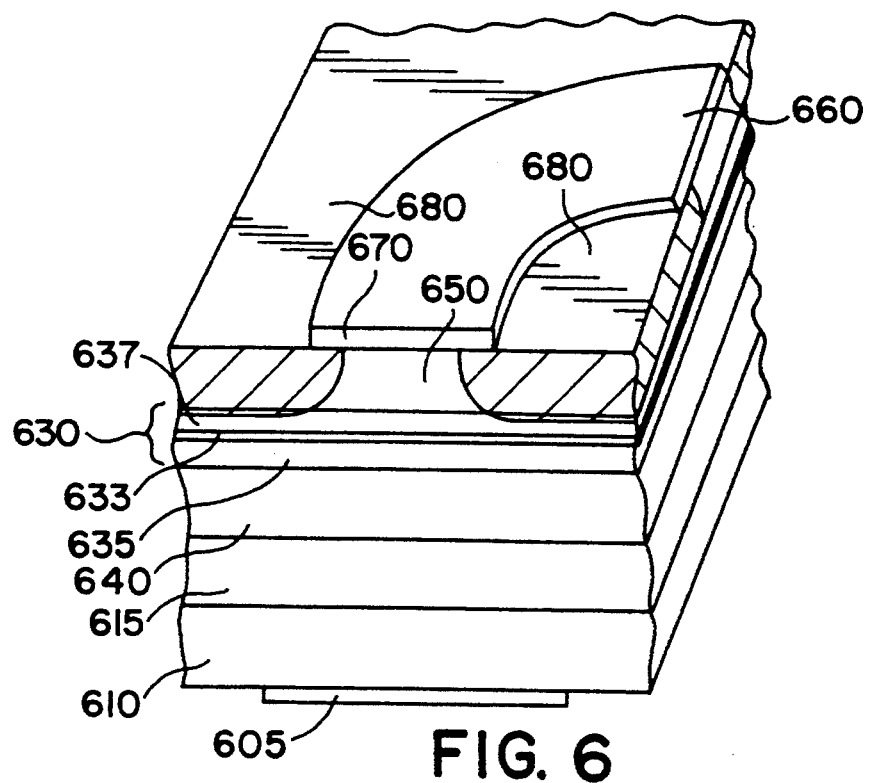
FIG. 6 is a simplified cross-sectional representation of a semiconductor laser diode device in accordance with an embodiment of the invention.

FIG. 6 is a simplified diagram of a laser device 600 made using the foregoing technique. The device, on GaAs substrate and buffer layers 610 and 615, includes an active region 630 between $Al_xGa_{1-x}As$ confining layers 640 and 650, of opposite conductivity types. The active region includes the quantum well 633 between undoped $Al_xGa_{1-x}As$ waveguide layers 635 and 637. The diagram also shows the curved top contact stripe 660, the underlying GaAs cap layer 670, and bottom electrode 605. As noted in the foregoing description the native oxide of this example, 680, extends through the entire upper confining layer 650 and slightly into the upper waveguide layer 637.

Figure 7:
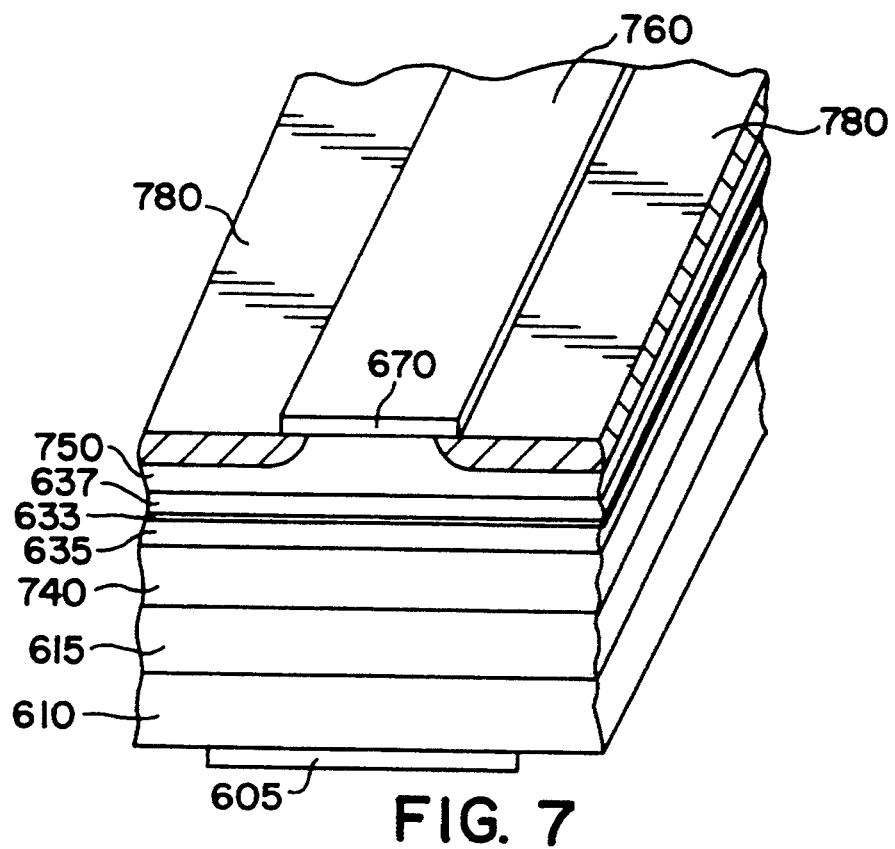
FIG. 7 is a simplified cross-sectional diagram of another semiconductor laser device in accordance with a embodiment of the invention.

In the description in conjunction with FIGS. 1-6, the native oxide of aluminum extends through the entire upper confining layer of the laser diode and even, to a small extent, into the waveguide region. Applicant has discovered that effective optical confinement, tailored to obtain desired operating conditions, can be achieved with a thick (generally, about 3000 Å or more) native oxide that does not necessarily extend through the entire confining layer. Generally, a native oxide that extends through at least one-third of the confining layer is preferred. FIG. 7 shows an embodiment of the invention having a linear stripe 760 and wherein the thick oxide 780 is controlled (e.g. by controlling the time of exposure and/or temperature in producing the native oxide) to extend about half way through the upper confining layer. In this example, the aluminum fraction (x) of the $Al_xGa_{1-x}As$ confining layers 740 and 750 is relatively low, for example about 0.4, which results in lower vertical (i.e., in the direction transverse the layers) confinement of the laser beam. [Layers with like reference numerals to those of FIG. 6 represent similar structure.] As described further hereinbelow, less vertical confinement permits greater expansion of the beam into the confining layers and, accordingly, a larger effective lateral refractive index step encountered by the beam as a result of the native oxide in the confining layer.

In accordance with a feature of the invention, by adjusting the thickness of the native oxide outside of the active stripe, one is able to control simultaneously both the optical field and the gain profile. In the next described example (further described in F. Kish et al., Appl. Phys. Lett. 60, 71-73, 1992), this technique is used to produce coupled-stripe planar native-oxide index-guided $Al_yGa_{1-y}As$-GaAs-$In_xGa_{1-x}As$ quantum well heterostructure laser arrays operating in-phase (0° phase shift between emitters). The 10-stripe arrays ($\sim$3-$\mu$m-wide emitters on 4-$\mu$m centers) exhibit near diffraction-limited single-lobe far-field patterns with low continuous (cw) threshold currents ($\sim$45 mA) and cw output powers of >100 mW per uncoated facet.

The QWH crystal employed is this example is again grown by metalorganic chemical vapor deposition (MOCVD). The crystal is grown on an n-type GaAs substrate at 800° C., except an $In_xGa_{1-x}As$ quantum well (QW) which is grown at 630° C. to prevent In desorption from the crystal surface. The growth begins with an n-type GaAs buffer layer, followed by a $\sim$1.25 $\mu$m $Al_{0.8}Ga_{0.2}As$ n-type lower confining layer, a $\sim$3000 Å undoped active region, a 0.6 $\mu$m $Al_{0.3}Ga_{0.2}As$ p-type upper confining layer, and a heavily doped p-type GaAs contact layer ($\sim$1000 Å). The active region includes an outer $Al_{0.3}Ga_{0.7}As$ waveguide (WG) with a $\sim$100 Å $In_{0.1}Ga_{0.9}As$ QW in its center, confined by an $\sim$320 Å GaAs spacer layer on each side. This structure is a relatively high confinement structure designed for low-threshold operation. Higher output powers may be realized by employing an alternative lower confinement structure (e.g., lower composition confining layers and a thinner waveguide region for less vertical confinement).

Two different sets of laser diode arrays are fabricated in this example by patterning $\sim$1000 Å of $Si_3N_4$ into a 10-stripe array of 3 $\mu$m-wide stripes on 4 $\mu$m center-to-center spacings. The exposed GaAs cap (outside of the masking stripes) is then removed by chemical etching ($H_2SO_4:H_2O_2:H_2O$, 1:8:80) and the crystal is placed in an open-tube furnace (supplied with a $N_2$ carrier gas bubbled through $H_2O$ at $\sim$95° C.) at 450° C. One sample (index-guided) is oxidized for 50 min, resulting in the conversion of $\sim$0.4 $\mu$m of the $Al_{0.3}Ga_{0.2}As$ upper confining layer to native oxide. A second comparison set of gain-guided devices is fabricated by the formation of a thin ($\sim$1000 Å) native oxide (450° C., 15 min). The native oxide possesses excellent current-blocking properties and a lower refractive index ($n \approx 1.60$), and thus simultaneously confines the current and optical field in the active stripe regions for sufficiently deep oxides. Following oxidation, the $Si_3N_4$ masking stripes are removed in a $CF_4$ plasma and the crystals are Zn-diffused at 540° C. for 20 min to increase the doping in the stripe contact areas. The crystal is then lapped and polished, metallized with Ti-Au for the p-type contact and Ge-Ni-Au for the n-type contact, cleaved into $\sim$250 $\mu$m wide cavities, diced, and mounted p-side down on In-coated copper heat sinks for cw operation.

Figure 8:
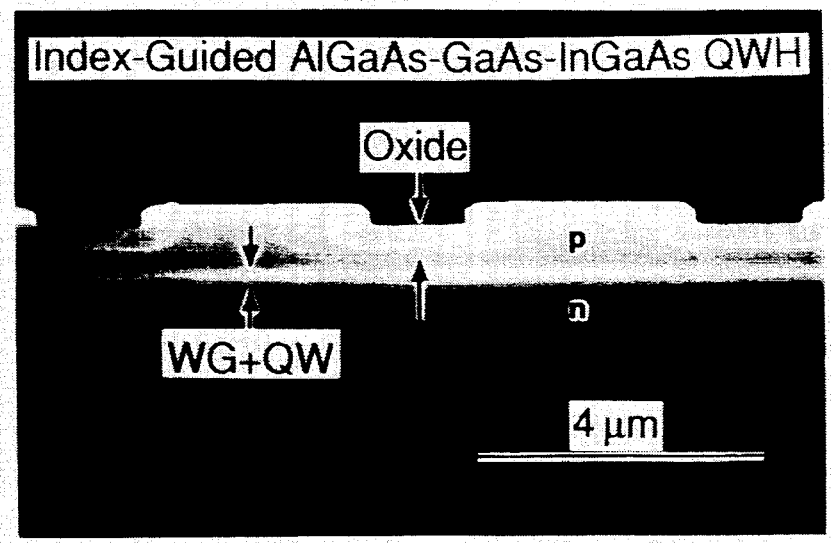
FIG. 8 is a scanning electron microscope image of a stained cross-section of part of a multiple strip semiconductor laser device in accordance with another embodiment of the invention.

A scanning electron microscope (SEM) image of a stained cross section of an index-guided device is shown after oxidation (450° C., 50 min) in FIG. 8. The oxide extends $\sim$0.4 $\mu$m down through the $Al_{0.2}Ga_{0.2}As$ upper confining layer, stopping $\sim$0.2 $\mu$m short of the active region (WG+QW in FIG. 1). This thickness is chosen to provide the proper index-step and degree of current confinement so that the overlap of the optical mode and overall gain will result in in-phase operation (0° phase shift between emitters). In addition, the oxidation process undercuts the GaAs cap and $Si_3N_4$ masking layer, resulting in $\sim$2.75-$\mu$m-wide emitters on 4-$\mu$m centers.

Figure 9:
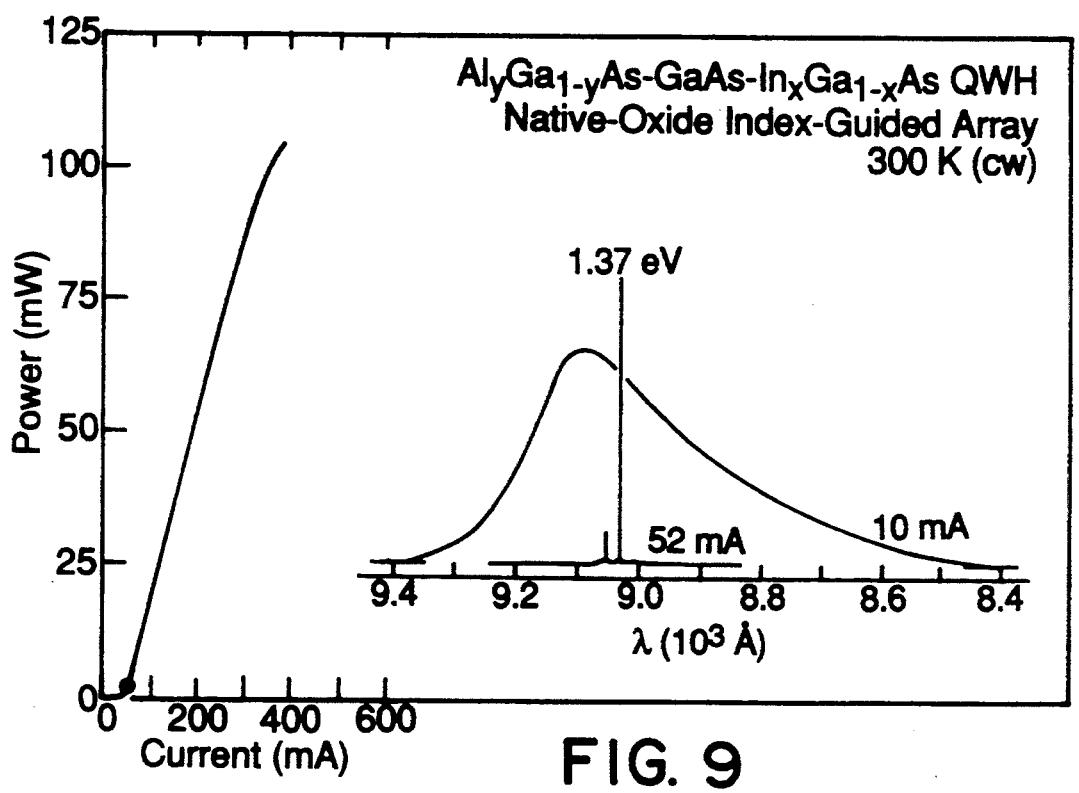
FIG. 9 is a graph of cw light output (single facet) versus current for the FIG. 8 device, the inset showing the wavelength of single longitudinal mode operation.

Continuous (cw) 300K operation of a typical 10-stripe in-phase coupled native-oxide index-guided laser array is shown in FIG. 9. The cw threshold current is 45 mA (uncoated facets $\sim$250 $\mu$m cavity), corresponding to 4.5 mA stripe (or $\sim$1.6 mA/$\mu$m). This is significantly less than coupled-stripe lasers fabricated by Si-O IILD ($I_{th} \sim$75 mA) utilizing the same crystal and geometry (see J. Major et al., Appl. Phys. Lett., 55, 271, 1989). and is indicative of the excellent current confinement provided by the native oxide. The total external differential quantum efficiency between 100 mA and 200 mA is ~52.5%, with a maximum 300K cw output power of 104 mW per facet limited by catastrophic facet damage. This output power is comparable to that of IILD coupled-stripe lasers fabricated on the same crystal with the same aperture (J. Major et al., supra). The diode lases with a primary single-longitudinal mode at a wavelength of 9030 Å (inset of FIG. 9).

Figure 10:
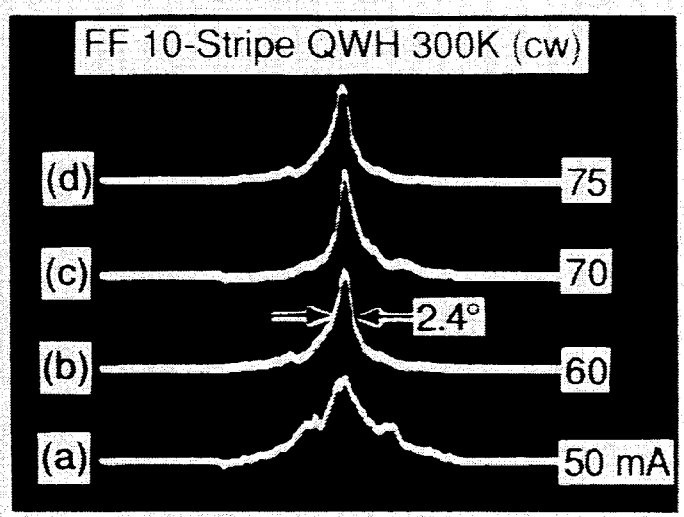
FIG. 10 shows far field emission patterns for the device of FIG. 8.

The coupling is verified by examining the far-field (FF) emission patterns of the arrays (under 300K cw excitation) collimated with a f/0.95 25 mm focal length lens and imaged on a linear CCD array. The FF pattern of the comparison gain-guided arrays, fabricated with a thin native oxide, is twin-lobed indicating out-of-phase operation (data not shown). The index-guided arrays fabricated with a deep native oxide, exhibit markedly different behavior. The FF pattern of a typical index-guided device measured at threshold (50 mA) is relatively broad with a full angle at half power (FAHP) of 5.0° (FIG. 10). At higher injection currents, the pattern narrows to a single lobe with a FAHP of 2.4° at 60 mA, and 2.6° at 70 and 75 mA (FIG. 10). At currents >75 mA (~1.5 $I_{th}$), the FF pattern broadens and is accompanied by the appearance of satellite diffraction peaks due to excitation of higher-order supermodes of the array (data not shown). The single lobe pattern is characteristic of operation in the lowest order supermode (n=1), and the 2.4° FAHP is within 1.7× of the diffraction limit (1.4°) calculated by coupled-mode theory for a 10-stripe array with in-phase emitters spaced 4 μm apart (λ=9030 Å) [see J. Butler et al., Appl. Phys. Lett., 44, 293, 1984]. The deviation from diffraction-limited operation may be due to some excitation of the next higher order supermode (n=2), whose overlap with the n=1 supermode would also produce a single-lobe pattern without any observable satellite diffraction peaks. An in-phase superposition consisting of 90% of the n=1 mode and 10% of the n=2 mode calculated by coupled-mode theory results in a single-lobe pattern with FAHP of 2.3°, closely agreeing with the observed FF patterns.

The near-field (NF) patterns of the device of FIG. 10 are examined by employing a f/1.08 6.5 mm focal length lens to image the emission onto a CCD linear array. At all currents above threshold, operation of all of the ten emitters is observed, with the NF showing a 4-μm periodic modulation between stripes (data not shown). In the regime corresponding to strong in-phase coupling ($I_{th} \lesssim I \lesssim 1.5 I_{th}$), the NF pattern exhibits modulation with a 4-μm periodicity and shows significant overlap of the optical modes with the envelope of the peaks corresponding to that predicted by coupled-mode theory for in-phase operation (data not shown).

Figure 11:
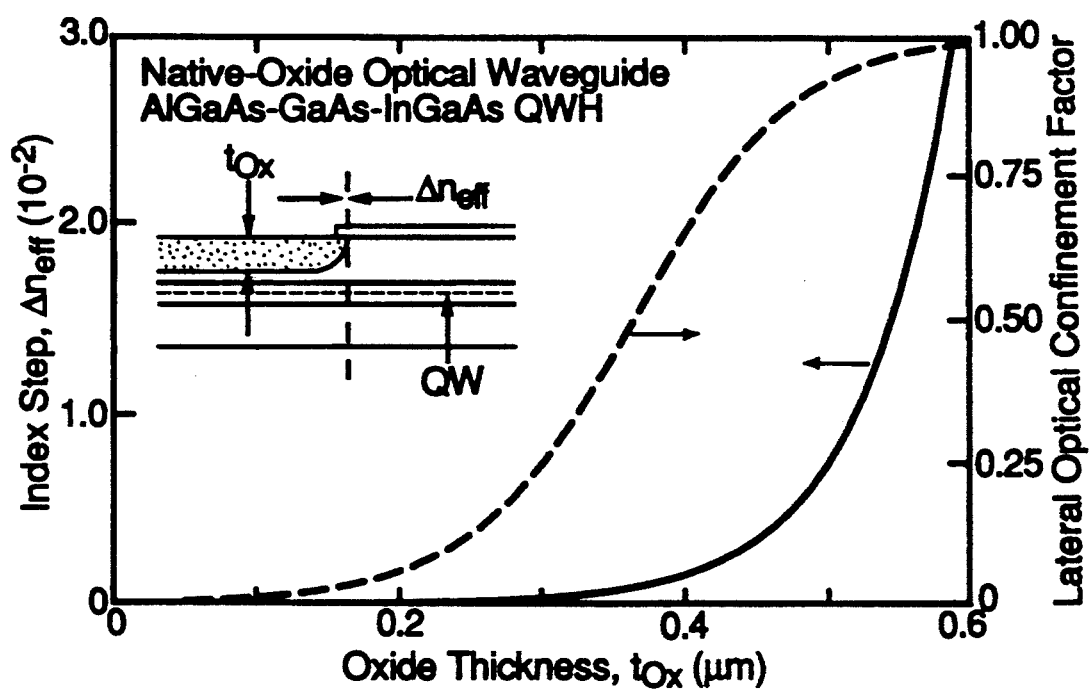
FIG. 11 shows calculated plots of refractive index step versus oxide thickness and transverse (that is, transverse the stripe, or lateral) optical confinement factor versus oxide thickness for a device of the type illustrated in the inset.

The ability to grow current-blocking, low-index (n≈1.60) native oxides throughout a significant portion of the high-gap Al$_y$Ga$_{1-y}$As upper confining layer allows tailoring of the index-step between emitters. FIG. 11 shows a calculated plot of the effective index-step as a function of native-oxide thickness (outside the laser stripe) for the laser structure of this example. The effective difference in index is calculated from $$\Delta n_{eff} = (\beta_{act}/k) - (\beta_{Ox}/k), \quad (1)$$

where k is the wave number, $\beta_{act}$ is the propagation constant in the active stripe, and $\beta_{Ox}$ is that in the native-oxide region calculated for a 4-layer slab waveguide [see G. Smith, IEEE J. Quantum Electron., QE-4, 288, 1968]. These calculations indicate an index-step of ~2×10$^{-3}$ for a ~0.4 μm thick native oxide. For reference, the transverse optical confinement factor for a 3-μm wide active stripe is also shown in FIG. 11. Variation of the oxide thickness changes the degree of optical confinement. Additionally, the degree of current confinement simultaneously varies with the thickness of the insulating native oxide. Precise control of this thickness changes the overlap of the optical field and gain distribution which directly affects in which supermode(s) a coupled-stripe array will oscillate.

The foregoing example demonstrates a high-performance coupled-stripe planar index-guided Al$_y$Ga$_{1-y}$As-GaAs-In$_x$Ga$_{1-x}$As laser array fabricated by conversion of a significant thickness of the high-gap Al$_y$Ga$_{1-y}$As upper confining layer to native oxide. As described, the oxide exhibits excellent current-blocking characteristics and a low refractive index, which is advantageous in the design and operation of a coupled-stripe array. Adjustment of the thickness of this oxide results in the proper overlap of the optical field and gain to produce in-phase operation compared to the out-of-phase operation observed for gain-guided devices fabricated with a thin (~1000 Å) native oxide. These devices exhibit low cw thresholds and cw output powers in excess of 100 mW per uncoated facet. The output powers and range of in-phase operation may be significantly increased by employing "window" structures and facet coatings on these devices.

Figure 12:
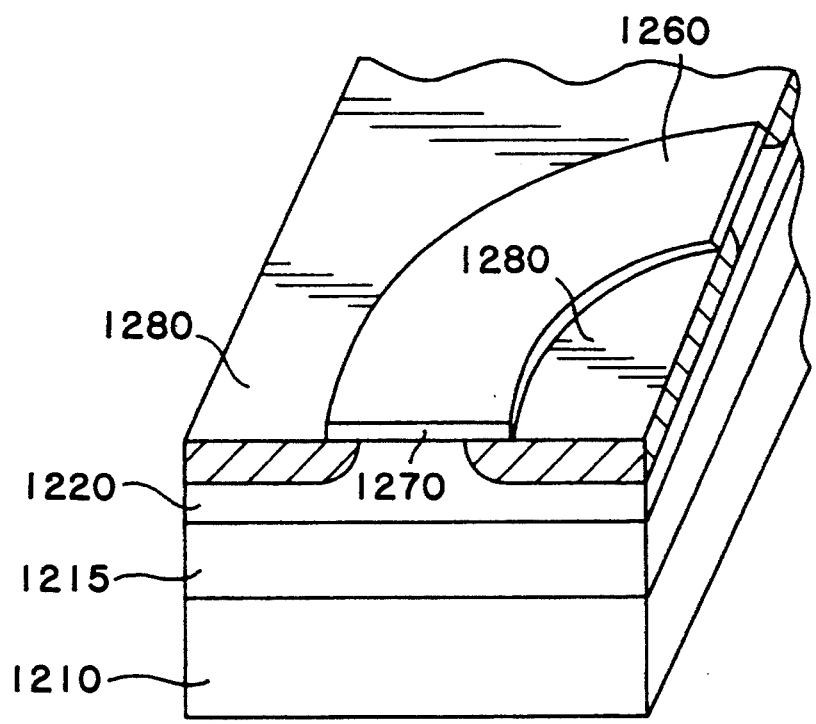
FIG. 12 is a simplified cross-sectional representation of a semiconductor optical waveguide in accordance with an embodiment of the invention.

FIG. 12 illustrates a passive curved waveguide in accordance with a form of the invention. The waveguide, which can be coupled (directly, or evanescently) with a suitable light source [not shown], includes, for example, GaAs substrate and buffer layers 1210 and 1215, and an Al$_x$Ga$_{1-x}$As (x=0.8, for example) waveguide layer 1220. The GaAs cap layer 1270, native oxide confining regions 1280 (which extend about half way through the aluminum-bearing material in this case), and the contact stripe 1260, can be formed using the previously described techniques.

Figure 13:
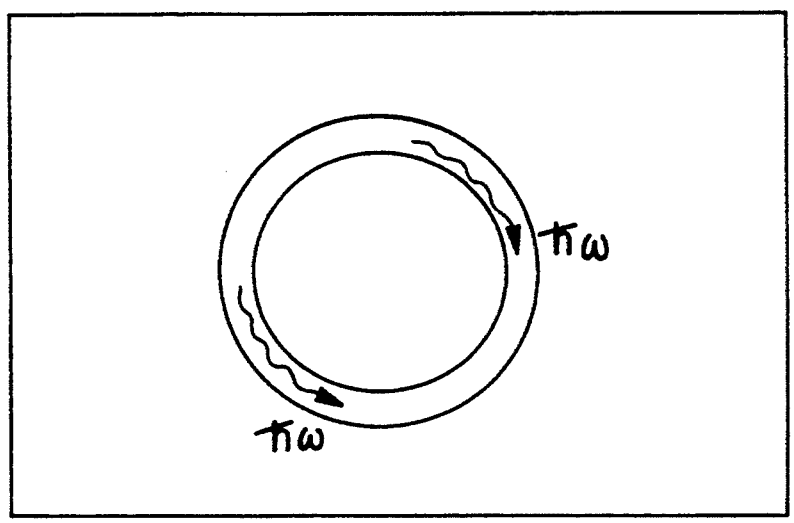
FIG. 13 illustrates the surface configuration of a ring laser device.
Figure 14:
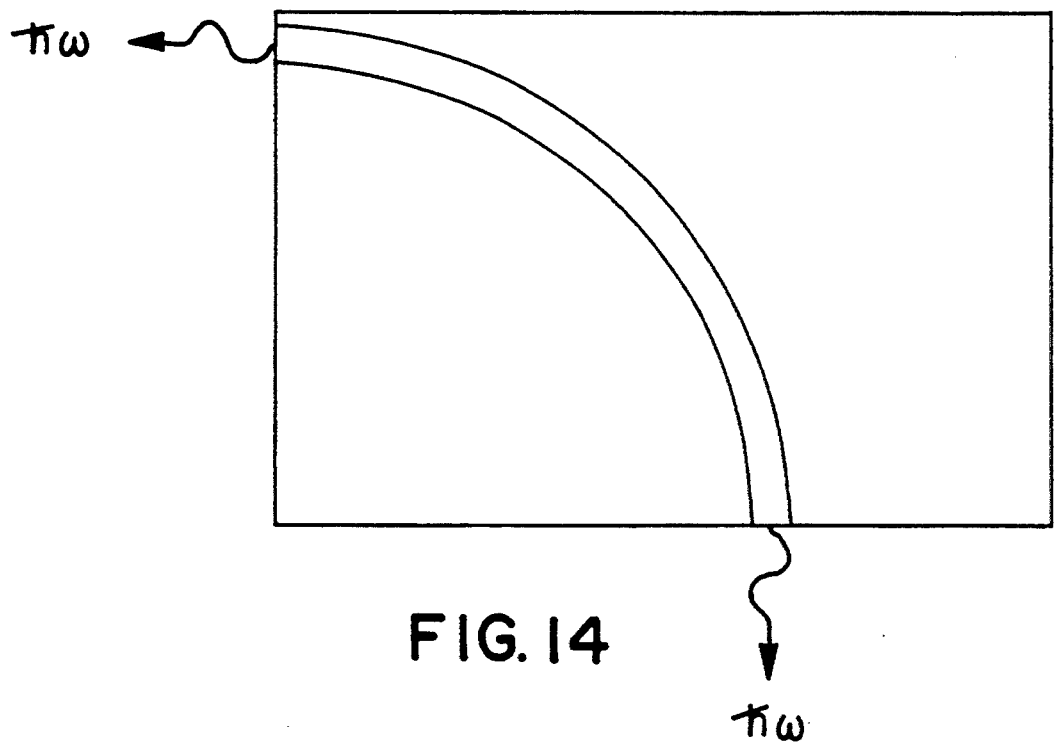
FIG. 14 illustrates the surface configuration of a quarter-ring laser or waveguide.
Figure 15:
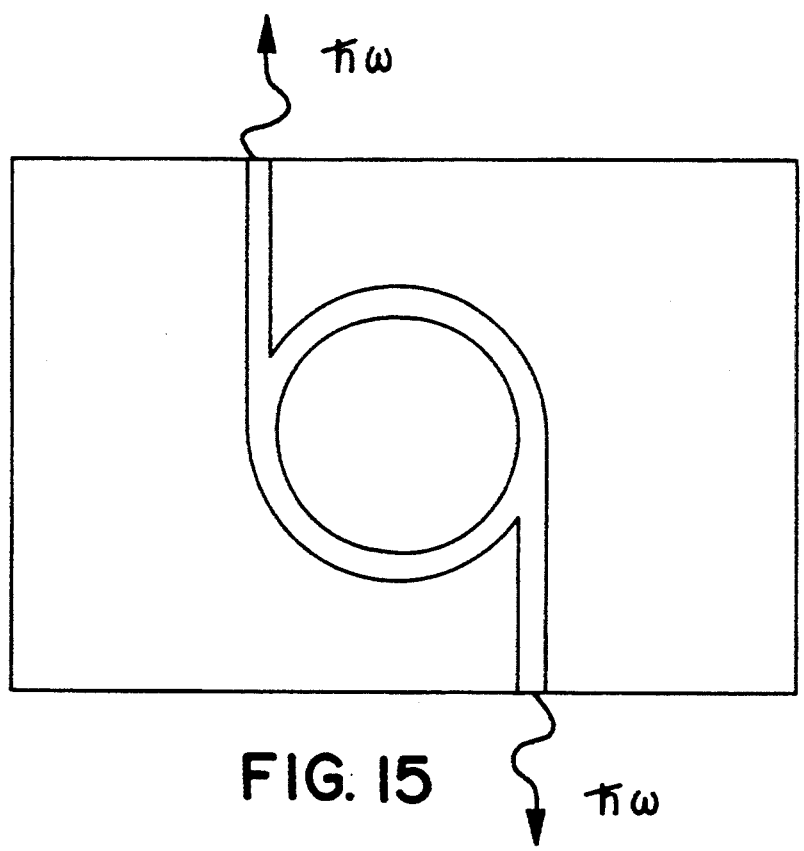
FIGS. 15 and 16 illustrate the surface configuration of ring lasers or waveguides with different branch coupling arrangements.
Figure 16:
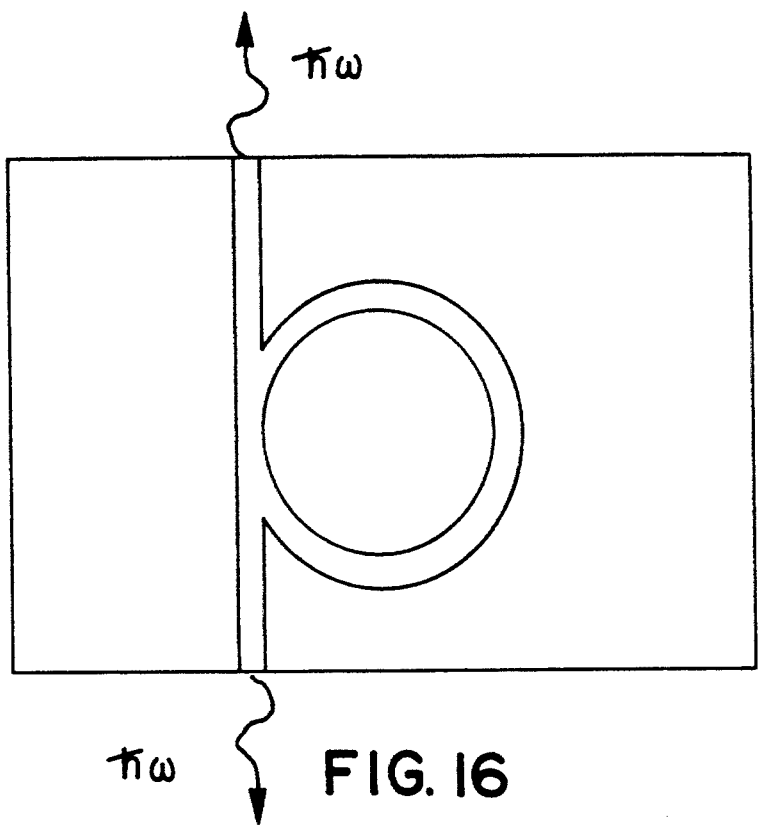
Figure 17:
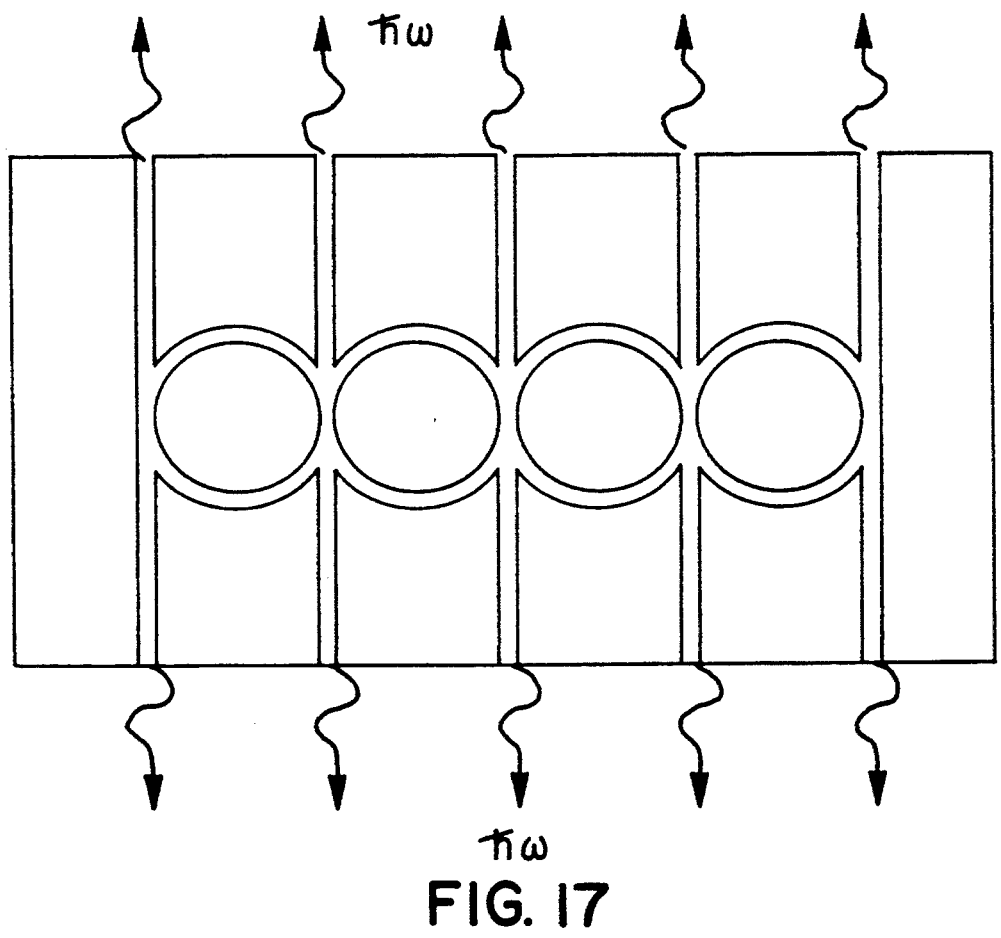
FIGS. 17 and 18 illustrate the surface configuration of multi-stripe lasers or waveguides with ring coupling.
Figure 18:
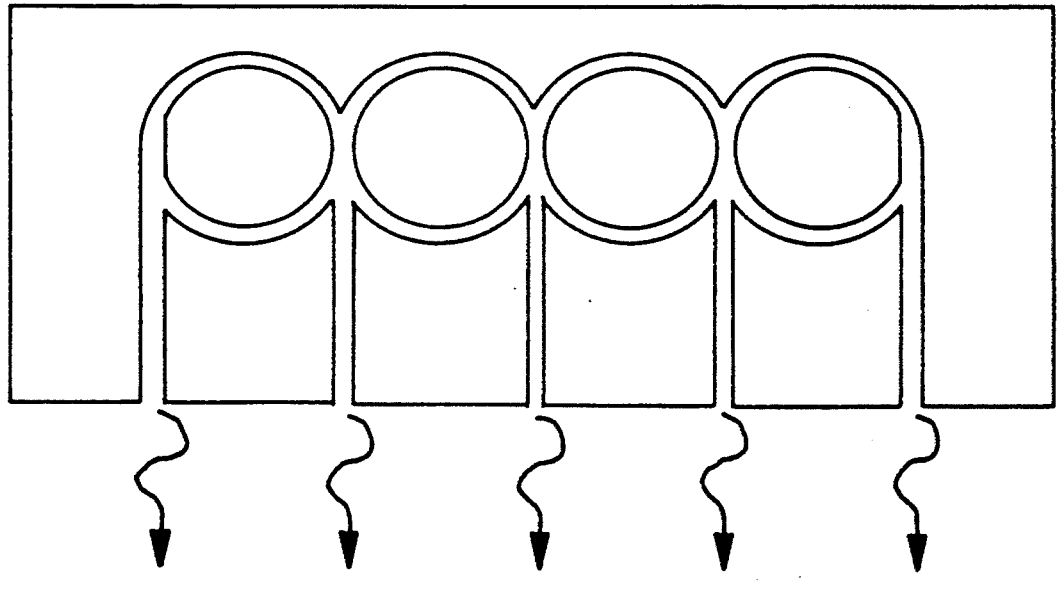
Figure 19:
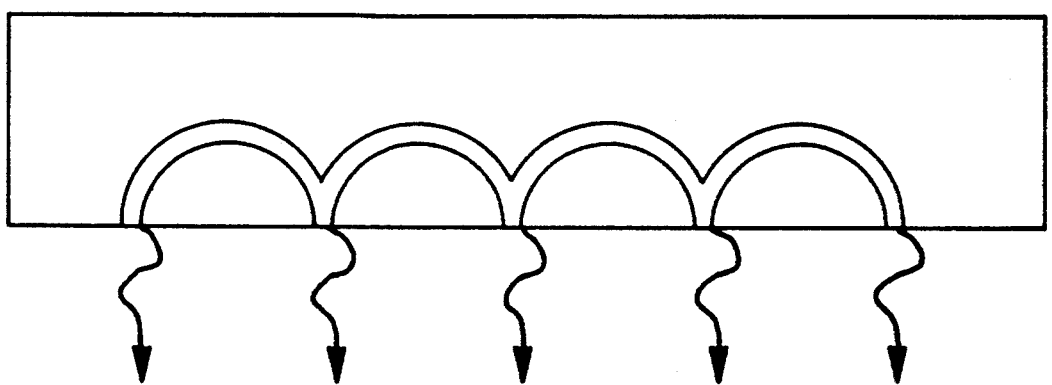
FIG. 19 illustrates the surface configuration of a series of coupled half-ring lasers or waveguides.
Figure 20:
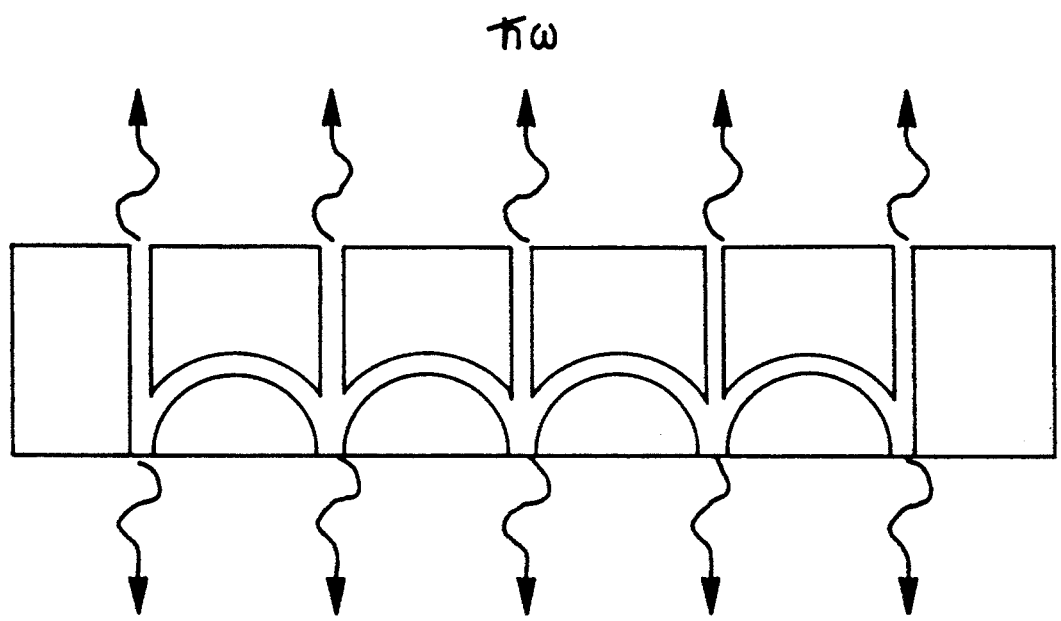
FIG. 20 illustrates the surface configuration of a multi-stripe laser or waveguide with half-ring coupling.
Figure 21:
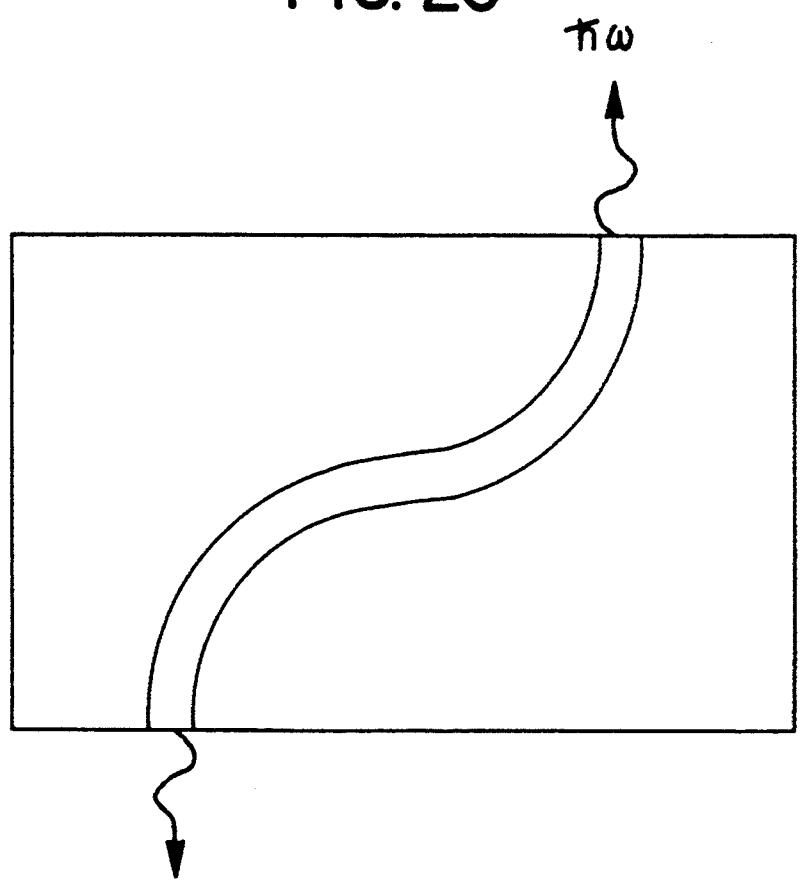
FIG. 21 illustrates the surface configuration of a curved laser or waveguide in which the light path becomes laterally offset.
Figure 22:
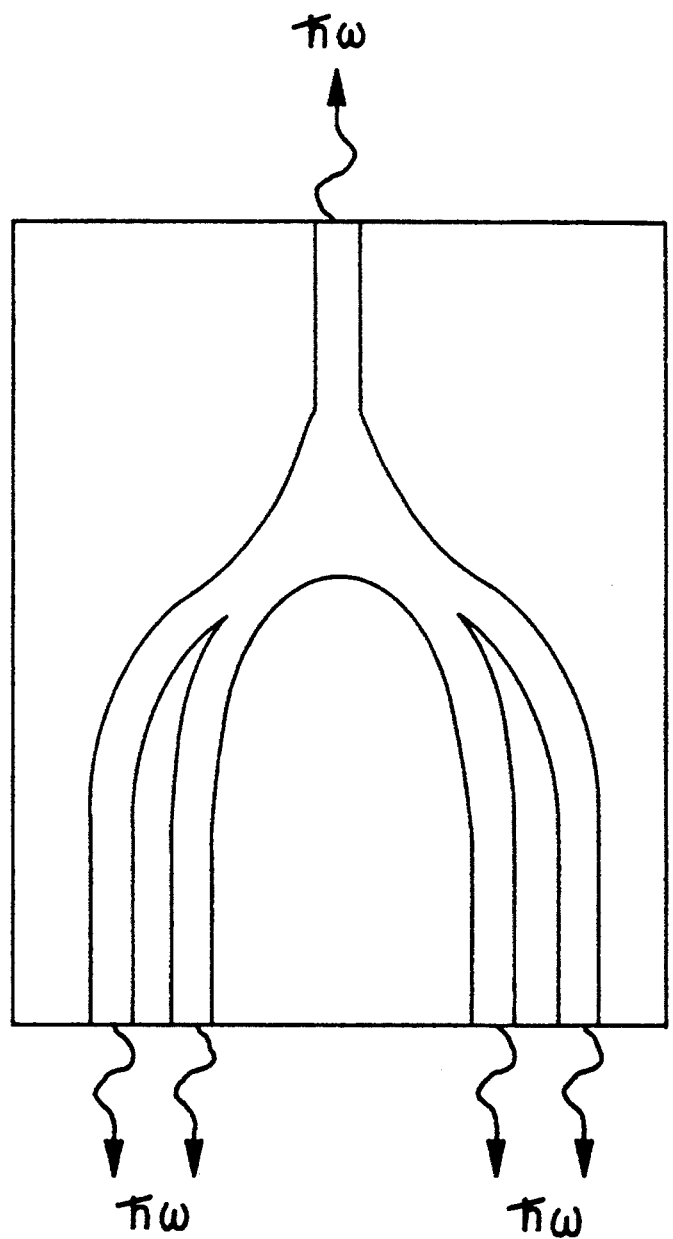
FIG. 22 illustrates the surface configuration of a laser or waveguide which couples light in a single branch with four curved branches.

FIGS. 13–23 illustrate configurations of lasers or waveguides (cross-sections of which may be, for example, of the types shown in FIGS. 6, 7 and/or 12) that can be advantageously implemented utilizing the principles of the invention. In these Figures, the white regions represent either the laser stripe configuration, which has thereunder, inter alia, a waveguide region with the index of refraction confinement in accordance with the present invention or, in the case of a waveguide, the index-confined waveguide region in accordance with the principles hereof. FIG. 13 illustrates a ring configuration, with light energy travelling in both directions. FIG. 14 illustrates a quarter ring, with light energy again travelling in both directions. This configuration, in an active or a passive device, can be utilized to obtain a ninety degree change of direction of the light path. FIGS. 15 and 16 illustrate ring laser or waveguide configurations with tangentially coupled branches. In FIGS. 17 and 18, multi-stripe lasers are shown as being coupled by ring lasers, such as for phase locking. The stripe spacing can be substantial. FIG. 20 shows a similar arrangement, but with half-ring lasers, and FIG. 19 shows a series of coupled half-rings. The locking or tuning provide by these configurations can result in enhanced longitudinal and/or transverse mode operation. FIG. 21 shows curved sections in an "S-bend"

arrangement for providing an active or passive lateral offset of the optical beam path. FIG. 22 illustrates the surface configuration of a laser or waveguide which couples light in a single branch with four curved branches.

The invention has been described with reference to particular preferred embodiments, but variations within the spirit and scope of the invention will occur to those skilled in the art. For example, while the aluminum-bearing III-V semiconductor material aluminum gallium arsenide has been described in embodiments hereof, it will be understood that the devices and technique hereof can employ other aluminum-bearing III-V semiconductor materials, such as indium aluminum gallium phosphide, indium aluminum gallium arsenide, or aluminum gallium phosphide. [Reference can be made to F. Kish et al., J. of Appl. Phys. 71, 15 Mar. 1992.] Also, it will be understood that the indicated confining layers can be multiple layers, one or more of which comprises the aluminum-bearing III-V semiconductor material. Finally, it will be understood that devices can integrate the aluminum-bearing III-V semiconductor material (from which the native oxide is formed) with other non-III-V semiconductor materials.

We claim:

1. A method of making a semiconductor laser having a light path that is at least partially curved, comprising the steps of:

forming a layered semiconductor structure comprising an active region between first and second semiconductor confining layers, said first and second semiconductor confining layers being of opposite conductivity types, and said first semiconductor confining layer being an aluminum-bearing III-V semiconductor material;

applying a mask pattern over said first semiconductor confining layer, said pattern including a stripe that is at least partially curved;

exposing unmasked portions of said first semiconductor confining layer to a water-containing environment and a temperature of at least 375 degrees C. for a time sufficient to form a native oxide of aluminum in said first semiconductor confining layer, said native oxide having a thickness of at least 3000 Å; and coupling respective electrodes with said first and second semiconductor confining layers.

2. The method as defined by claim 1, wherein said active region includes at least a waveguide layer and a quantum well layer, and wherein said respective electrodes are coupled to said semiconductor confining layers through further respective semiconductor layers.

3. The method as defined by claim 1, wherein said curved portion is in the shape of an annular arc.

4. The method as defined by claim 1, wherein said curved portion is an annular ring.

5. The method as defined by claim 3, wherein said time is sufficient to have said native oxide extend through at least most of the thickness of said first confining layer.

6. The method as defined by claim 4, wherein said time is sufficient to have said native oxide extend through at least most of the thickness of said first confining layer.

7. The method as defined by claim 6, wherein said native oxide extends through the entire thickness of said first confining layer.

8. The method as defined by claim 1, wherein said aluminum-bearing material comprises $Al_xGa_{1-x}As$, where x is at least 0.3.

9. The method as defined by claim 1, wherein said water-containing environment comprises water vapor and an inert gas, and wherein said temperature is at least 450 degrees C.

10. A method of making a semiconductor laser, comprising the steps of:

forming a layered semiconductor structure comprising an active region between first and second semiconductor confining layers, said first and second semiconductor confining layers being of opposite conductivity types, and said first semiconductor confining layer being an aluminum-bearing III-V semiconductor material;

applying a mask pattern over said first semiconductor confining layer;

exposing unmasked portions of said first semiconductor confining layer to a water-containing environment and a temperature of at least 375 degrees C. for a time sufficient to form a native oxide of aluminum in said first semiconductor confining layer that is at least 3000 Angstroms thick and extends through at least one-third of the thickness of said first confining layer; and coupling respective electrodes with said first and second semiconductor confining layers.

11. The method as defined by claim 10, wherein said active region includes at least a waveguide layer and a quantum well layer, and wherein said respective electrodes are coupled to said semiconductor confining layers through further respective semiconductor layers.

12. The method as defined by claim 10, wherein said time is sufficient to have said native oxide extend through at least most of the thickness of said first confining layer.

13. The method as defined by claim 10, wherein said native oxide extends through the entire thickness of said first confining layer.

14. The method as defined by claim 10, wherein said aluminum-bearing material comprises $Al_xGa_{1-x}As$, where x is at least 0.3.

15. The method as defined by claim 10, wherein said water-containing environment comprises water vapor and an inert gas, and wherein said temperature is at least 450 degrees C.

16. A method of producing a lateral index of refraction step of given effective size, comprising the steps of:

forming a layered semiconductor structure that includes a second semiconductor layer, a waveguide layer disposed on said second semiconductor layer, and a first semiconductor layer disposed on said waveguide layer, said first semiconductor layer being an aluminum-bearing III-V semiconductor material;

applying a masking pattern over at least part of said first semiconductor layer;

initiating treatment of the unmasked surface of said first semiconductor layer with a water-containing environment and a temperature of at least 375 degrees C. to initiate formation of a native oxide of aluminum in said first semiconductor layer; and continuing said treatment for a selected period of time that determines the size of the effective lateral index of refraction step in the lateral direction of said waveguide layer and said first semiconductor layer.

17. The method as defined by claim 16, wherein said time is sufficient to have said native oxide extend through at least half of the thickness of said first semiconductor layer.

18. The method as defined by claim 16, wherein said aluminum-bearing material comprises $Al_xGa_{1-x}As$, where x is at least 0.3.

19. The method as defined by claim 16, wherein said water-containing environment comprises water vapor and an inert gas, and wherein said temperature is at least 450 degrees C.

* * * * *